United States Patent [19]

Frankeny

[11] Patent Number: 5,638,019
[45] Date of Patent: Jun. 10, 1997

[54] ACCURATELY GENERATING PRECISELY SKEWED CLOCK SIGNALS

[75] Inventor: Richard F. Frankeny, Elgin, Tex.

[73] Assignee: International Business Machines Corporation, Armonk, N.Y.

[21] Appl. No.: 559,901

[22] Filed: Nov. 17, 1995

[51] Int. Cl.$^6$ ........................................ H03K 1/04
[52] U.S. Cl. ..................... 327/295; 327/262; 327/269; 327/271; 327/272; 331/1 A; 331/25
[58] Field of Search ........................... 327/157, 155, 327/158, 161, 250, 231, 232, 233, 237, 239, 243, 244, 245, 261, 269–272, 276–278, 284, 295, 262, 113; 331/1 A, 2, 25

[56] References Cited

U.S. PATENT DOCUMENTS

| | | | |
|---|---|---|---|
| 4,147,891 | 4/1979 | Roos | 375/364 |
| 4,680,779 | 7/1987 | Wakerly | 327/145 |
| 4,755,704 | 7/1988 | Flora et al. | 327/152 |
| 4,868,514 | 9/1989 | Azevedo et al. | 327/159 |
| 5,043,596 | 8/1991 | Masuda et al. | 327/297 |
| 5,087,829 | 2/1992 | Ishibashi et al. | 327/152 |
| 5,144,170 | 9/1992 | Parker | 327/141 |
| 5,148,113 | 9/1992 | Wight et al. | 327/3 |
| 5,216,302 | 6/1993 | Tanizawa | 327/157 |
| 5,237,224 | 8/1993 | DeLisle et al. | 327/276 |
| 5,298,866 | 3/1994 | Kaplinsky | 327/261 |
| 5,355,037 | 10/1994 | Andresen et al. | 327/158 |
| 5,432,480 | 7/1995 | Popescu | 331/11 |

*Primary Examiner*—Timothy P. Callahan
*Assistant Examiner*—Kenneth B. Wells
*Attorney, Agent, or Firm*—Casimer K. Salys

[57] ABSTRACT

Systems and methods for accurately skewing periodic signals using a matching pair of voltage controlled delay lines, a frequency comparator, and a common control signal to the delay lines as generated by the frequency comparator. A feedback oscillation is established in a loop including one of the voltage controlled delay lines. The frequency comparator controls the frequency of the loop oscillation in direct proportion to a comparison between the oscillation frequency and a subharmonic of a base clock signal. The base clock signal is sent through the second voltage controlled delay line, which by matching of delay line characteristics and a common control signal introduces a clock period of skew or delay over the length of the second voltage controlled delay line. Taps to nodes in the succession of device stages making up the second voltage controlled delay line provides the clock signals with directly proportioned skews, the skews being defined by precise physical divisions of the delay line. The magnitude of the skew is thereby accurately controlled and precisely selected.

8 Claims, 6 Drawing Sheets

TAPPED VOLTAGE CONTROLLED DELAY LINE

ACCURATELY GENERATING PRECISELY SKEWED CLOCK SIGNALS

CROSS REFERENCE TO RELATED APPLICATIONS

The present invention is related to U.S. patent application Ser. No. 08/556,251, filed Nov. 13, 1995, which application is assigned to the assignee of the present application.

1. Field of the Invention

The present invention is generally related to electronic signal processing. More particularly, the invention is directed to the precise skewing of clock signals or the like.

2. Background of the Invention

The accurate alignment of clock signals, namely, the edges of clock pulses, is the subject of acute concern to designers of synchronous digital data processing systems. This is particularly true for computers which now routinely operate at more than 100 MHz. Such clock frequencies presently require that the printed circuit board wiring layouts and integrated circuit chip logic functions be refined to compensate for differences in the transmission lines used to distribute the clock signal from the clock chip to the diversely located chips or logic devices on the printed circuit boards. Techniques have been developed to selectively introduce delays along short clock signal paths and to compensate for phase misalignments of clock signals arriving along different paths. Unfortunately, the techniques are often complex and subject to variation with thermal effects.

Though phase locked loops are often used to adjust for clock skew within individual integrated circuit chips, where impedance and gate delays introduced clock skew, they cannot compensate for skew due to board wiring and packaging in the signal paths between the clock chip, or external clock source, and the actual pin inputs to the individual chips.

The skews introduced into clock signals between their origin at the clock chip and the input pins of the driven chips are the result of the transmission line characteristics of the individual clock lines. One technique for improving the phase alignment of the clock signal as it appears at each of the diversely located chips is to selectively delay or skew various one of the clock signals to offset for clock signals which have the longest delays. Unfortunately, techniques for selectively delaying and skewing the clock signals either involve complex circuits or are sensitive to thermal effects. As the accuracy and precision of the skews decrease, the complexity of the board design increases to satisfy the worse case combination of effects caused by misalignment of the clock signal among the various interconnected chips on the board.

Therefore, there exists a need for systems and methods which can accurately skew a clock signal and provide precise increments of skew referenced to the base clock signal.

SUMMARY OF THE INVENTION

The present invention provides a system for accurately generating precise and incrementally selectable skewed clock signals, being comprised of a means for creating a feedback oscillation signal using a first controllable delay line, a second controllable delay line, fabricated to be substantially identical to the first controllable delay line, connected to receive a base clock signal, frequency comparator means for concurrently controlling the first and second controllable delay lines in proportion to the difference between the frequency of the feedback oscillation signal and a subharmonic of the base clock signal, and means for tapping the clock signal at an incremental position along the second controllable delay line. In another form, the invention relates to a method for generating skewed clock signals, comprising the steps of creating a feedback oscillation signal using a first controllable delay line, providing a base clock signal to a second controllable delay line, the second controllable delay line being fabricated to be substantially identical to the first controllable delay line, concurrently controlling the first and second controllable delay lines in proportion to the difference between the frequencies of the feedback oscillation signal and a subharmonic of the base clock signal, and tapping the clock signal from at least one incremental position along the second controllable delay line.

A particularized form of the invention involves a matching pair of voltage controlled delay lines, the delay lines being commonly controlled by the output of a frequency comparator. One voltage controlled delay line is configured in a positive feedback loop to oscillate at a first frequency, the first frequency being one input to the frequency comparator. The second delay line is driven directly by a base clock signal. A directly derived signal operating at half the base clock frequency is the second input to the comparator. In steady state operation, the delay across the second voltage controlled delay line is equal to one period of the base clock signal with an accuracy approaching the frequency of the base clock signal. Precise increments of skew are obtainable from the second voltage controlled delay line by direct taps off nodes between successive delay line stages.

The invention is particularly useful for managing clock signal skew compensation in the printed circuit boards of computers, where skewed clock signals in precise increments of skew are needed to offset transmission line effects on clock signals distributed to the various chips on the board.

These and other features of the invention will be more clearly understood and appreciated upon considering the detailed embodiment which follows hereinafter.

DESCRIPTION OF THE PREFERRED EMBODIMENT

Figure 1:
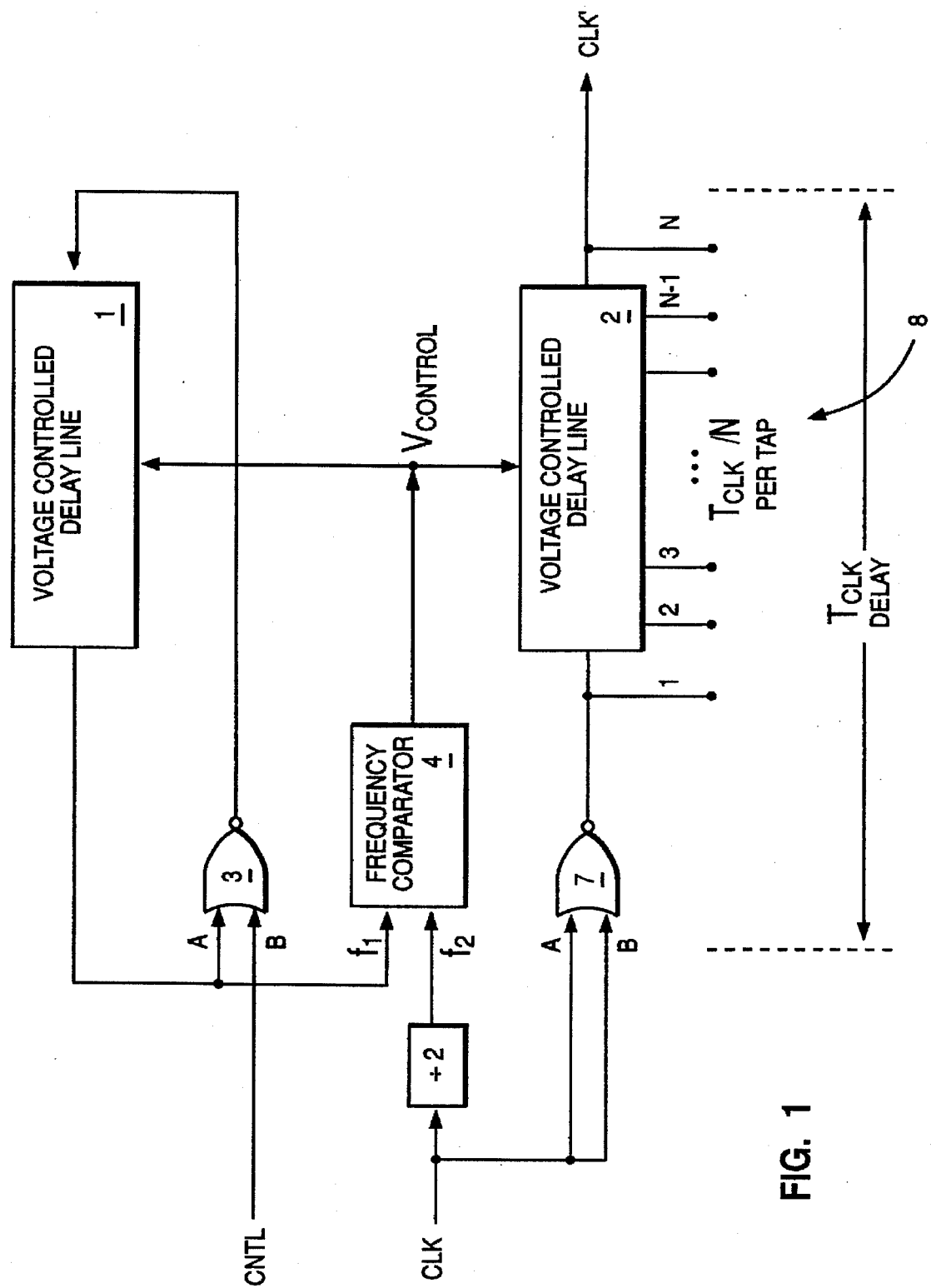
FIG. 1 is a schematic block diagram of a system for generating precisely skewed clock signals.

FIG. 1 depicts by schematic block diagram an embodiment of the invention, which invention provides skewed clock signals in precise increments from physical taps off a voltage controlled delay line. The elements of the system include a pair of voltage controlled delay lines 1 and 2 which are fabricated to be substantially identical. The matching requirement of the delay lines is preferably attained by fabricating the two on a common integrated circuit chip, in close proximity and with identical electronic circuits and devices. Voltage controlled delay line 1 is configured with an even number of inverter stages, so that when combined with NOR gate 3 oscillation is established in the loop when the enable signal CNTL is at a low level. The oscillating frequency $f_1$ serves as one input to frequency comparator 4. The other input to frequency comparator 4, of frequency $f_2$, is directly derived from the base clock signal CLK through divide by two frequency divider 6. The output from frequency comparator 4 is voltage $V_{CONTROL}$, which voltage is provided to both voltage controlled delay lines 1 and 2 as the regulating input. Base clock signal CLK is also provided to voltage controlled delay line 2 after passing through matching NOR gate 7.

During steady state operation, when frequencies $f_1$ and $f_2$ match, the time delay or skew between the base clock signal CLK and the output clock signal CLK' from voltage controlled delay line 2 is exactly equal to one clock period ($T_{CLK}$) of the base clock signal CLK. Furthermore, the accuracy of the time interval $T_{CLK}$ is defined by the accuracy of the crystal controlled clock signal CLK and frequency comparator 4 if voltage controlled delay lines 1 and 2 match.

The accurate and actively regulated time delay introduced by voltage controlled delay line 2 and NOR gate 7 is, as an aspect of the present invention, partitionable into precise increments of skew by physical taps 8 to incremental nodes between the input and output of voltage controlled delay line 2. For example, if voltage controlled delay line 2 is composed of individual stages providing N taps between the input and the output, the clock signal skew distinguishing successive taps is equal to $T_{CLK}/N$.

Figure 2:
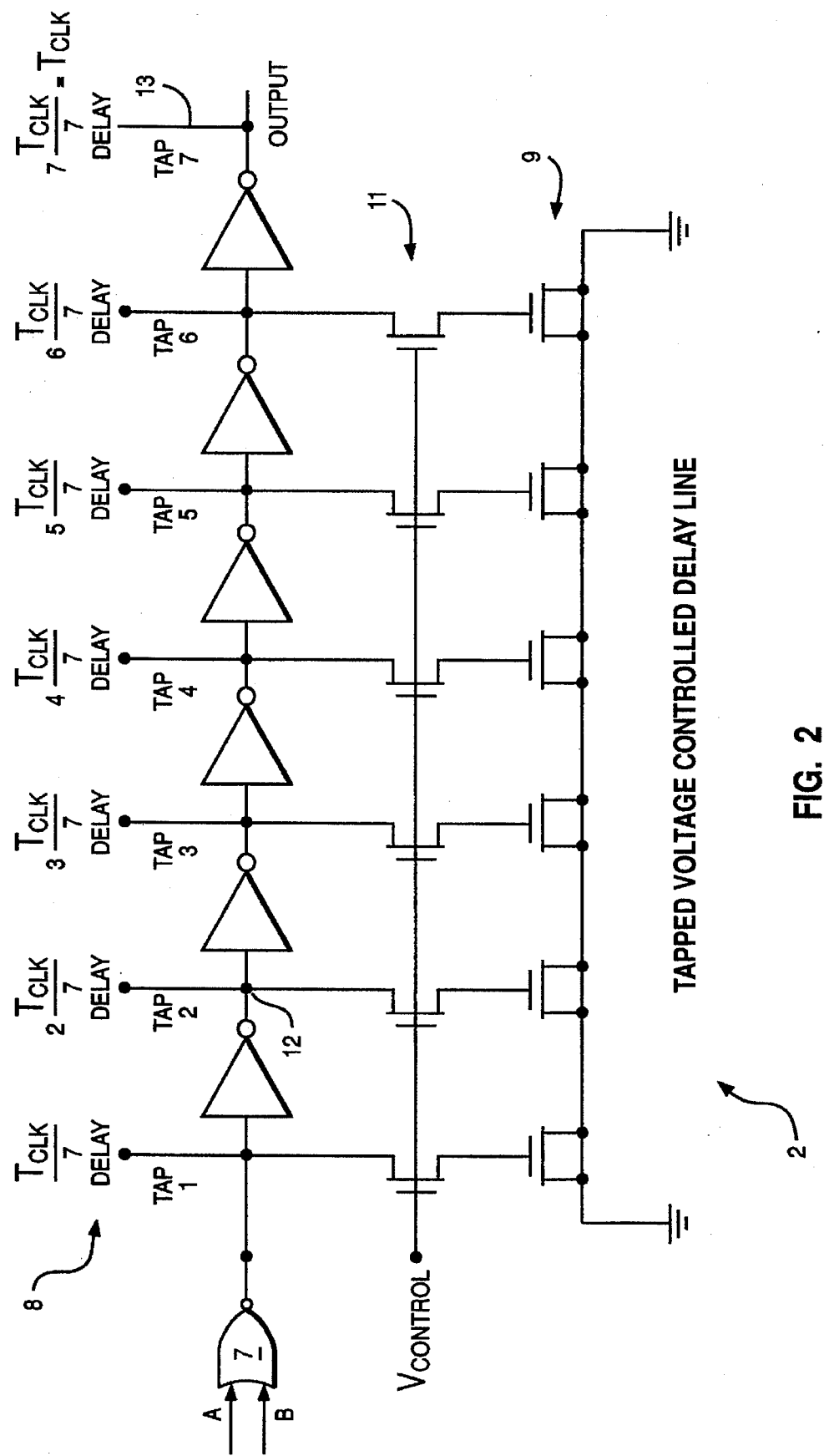
FIG. 2 is a schematic diagram illustrating a voltage controlled delay line with skew taps of the form used in FIG. 1.

FIG. 2 schematically illustrates an example of voltage controlled delay line 2 with taps for incrementally skewed forms of the base clock signal CLK. Field effect transistors 9 are connected to provide capacitor effects in proportion to the control voltage $V_{CONTROL}$ driving transistors 11. Voltage controlled delay line 2 in FIG. 2 differs from a standard voltage controlled delay line in that there are provided a succession of taps connected to nodes, such as 12, between successive stages in the delay line. The physical taps provide a precise and structurally constrained partition of the clock period interval of skew distributed between the input to NOR gate 7 and last tap 13. For the embodiment depicted in FIG. 2, the clock signal is skewed in increments of value $T_{CLK}/7$ for each tap along the delay line. Clearly, the number of stages and corresponding number of taps is variable at the discretion of the system designer.

Voltage controlled delay line 1, and associated NOR gate 3, are substantially identical to the counterparts depicted in FIG. 2, but absent taps 8.

The accuracy of the skew obtainable by the circuit in FIG. 1 approaches the accuracy of the base clock signal CLK as the performance of frequency comparator 4 increases. In part, this is attributable to the fact that matching semiconductor device circuits fabricated in close proximity on a common chip have proven to exhibit highly matching electrical characteristics. Furthermore, since the delay lines are on the same chip they are also subject to the same thermal effects. Given the match of the voltage controlled delay lines 1 and 2, and the physical characteristics of the taps, the remaining sources of error are frequency comparator 4 and the base clock signal CLK. Since the base clock signal is crystal controlled and frequency comparator 4 can be refined as the accuracy needs change, taps 8 provide exceptionally accurate skewed versions of the base clock signal with active compensation for thermal and semiconductor device aging effects.

Figure 3:
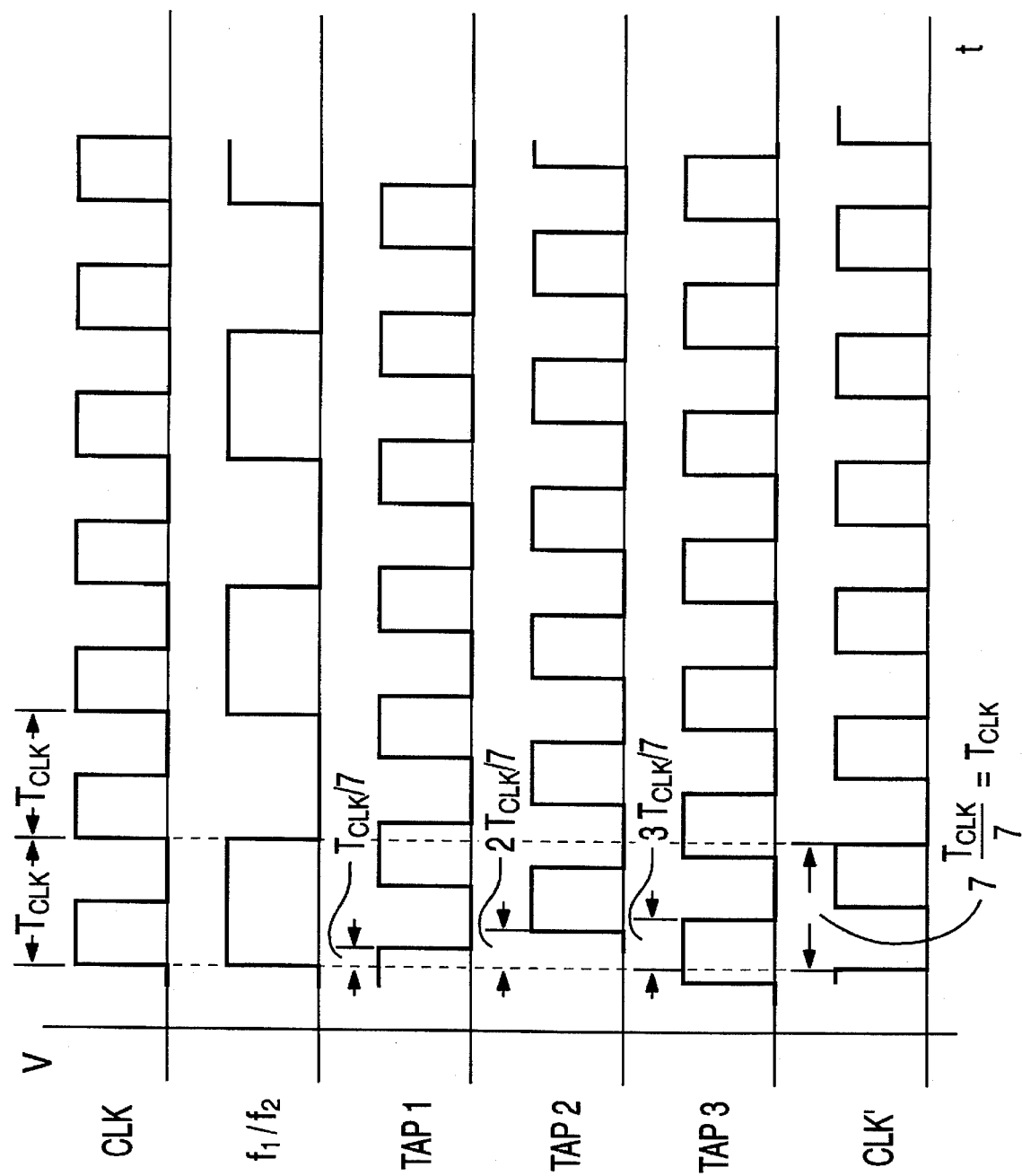
FIG. 3 is a schematic depicting waveforms as would appear in the schematic of FIG. 1.

FIG. 3 illustrates by waveforms the appearance of the signals in FIG. 1 when operating in a steady state. The frequencies of $f_1$ and $f_2$ are substantially identical. Under those conditions, each tap in succession from tap 1 to tap 7 contributes an additional clock signal skew of $T_{CLK}/7$, with the output clock signal CLK' being one full clock period $T_{CLK}$ delayed from the input clock signal CLK.

Figure 4:
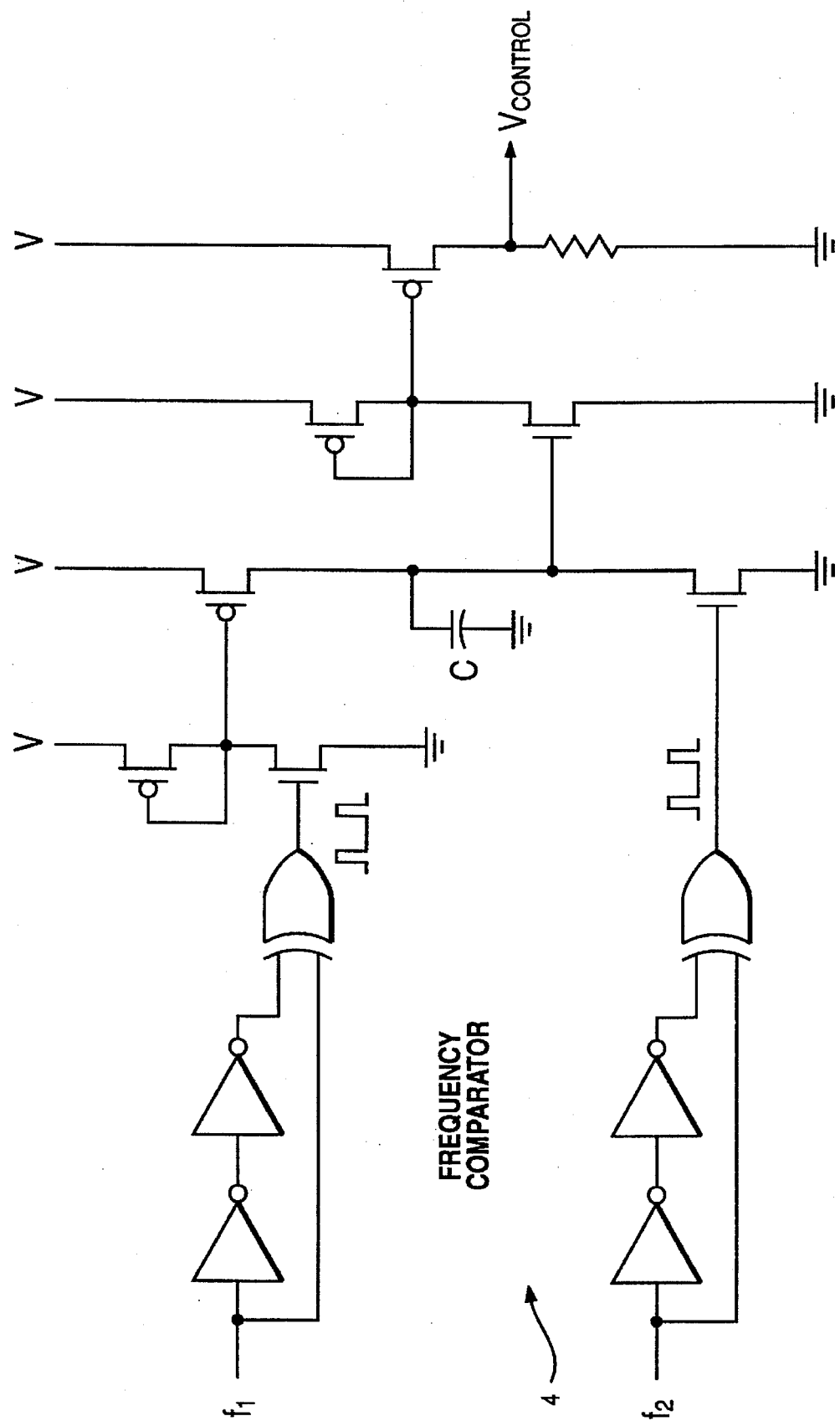
FIG. 4 is an electronic schematic of a representative frequency comparator.

FIG. 4 illustrates a simple example of frequency comparator 4, suitable to receive an input signal oscillating at frequency $f_1$ and clock signal subharmonic of frequency $f_2$. Output voltage $V_{CONTROL}$ is proportional to the difference in frequencies of the two signals. In the circuit of FIG. 4, output voltage $V_{CONTROL}$ is derived directly from the voltage of across capacitor C. As noted earlier, the accuracy of frequency comparator 4 in FIG. 1 may be increased as the accuracy needs of the skew increase. With such design changes the frequency comparator circuit will likely become more elaborate than the version depicted in FIG. 4.

Figure 5:
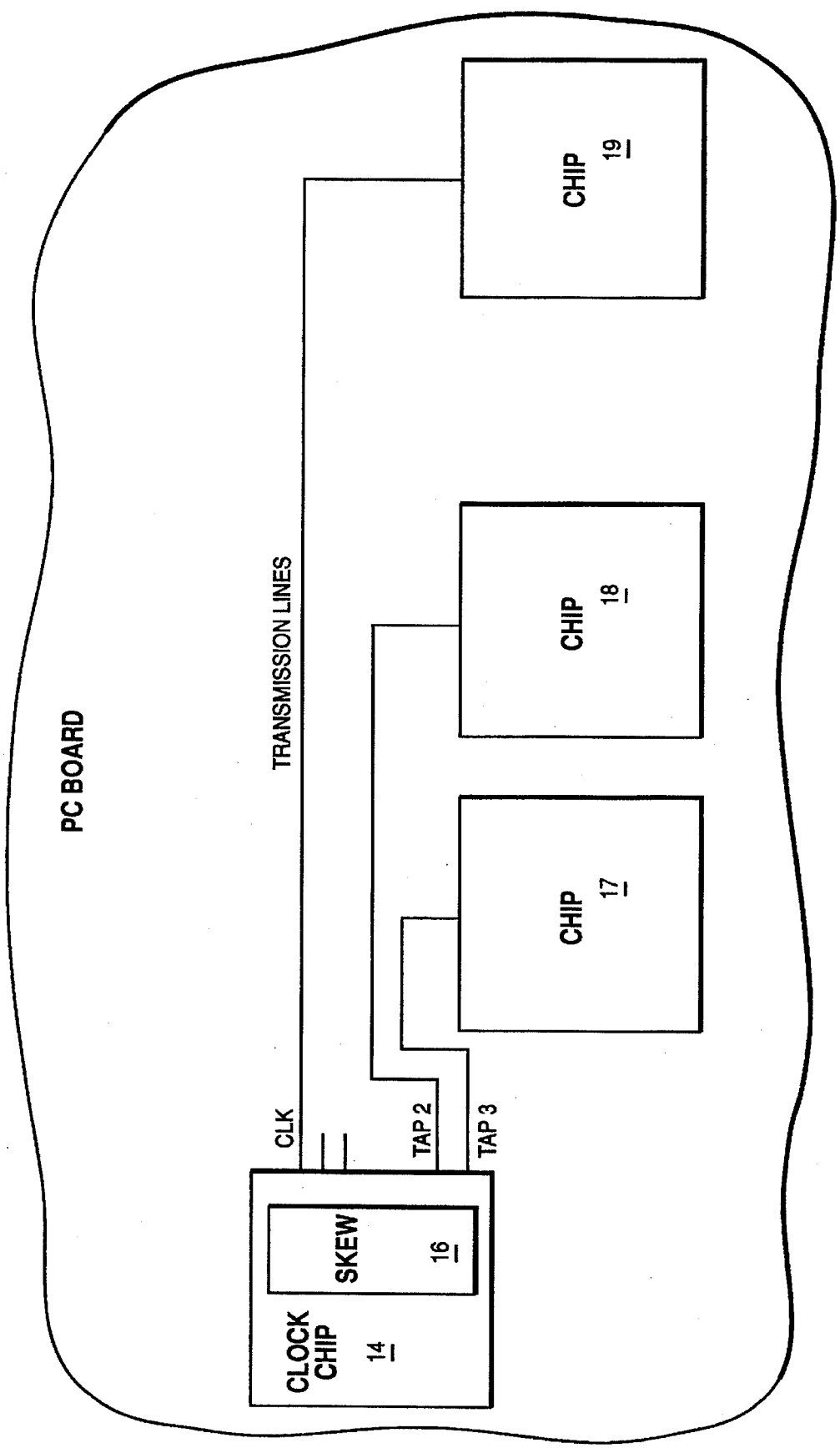
FIG. 5 is a schematic depicting chips distributed over a printed circuit board.

FIG. 5 schematically depicts a printed circuit board utilizing the skewed clock signals generated by the present invention. As shown, clock chip 14 with active skew system 16, such as described with reference to FIGS. 1 and 2, furnishes clock signals to chips 17, 18 and 19. Chip 19 is physically situated more distant from the clock chip 14 than chips 17 and 18. Each chip receives its clock signals over a transmission line. The time of flight of each transmission line is affected by the distance between clock chip 14 and the respective chip. As embodied in FIG. 5, the clock signal itself is sent directly to chip 19, with the recognition that the intervening transmission line will delay the arrival of a clock signal by a specified time interval. To synchronize operations within the chips, the slightly delayed clock signal provided to chip 18 is taken off tap 2 while the further delayed clock signal to chip 17 is taken off tap 3. As a consequence of this arrangement, the clock signals received in the respective chips are substantially in phase. Though subsequent interactions may affect this alignment of the signals as they propagate within and among the chips, the accurate skewing provided by clock chip 14 minimizes compensation as would otherwise be required in the chips or combinational logic.

Figure 6:
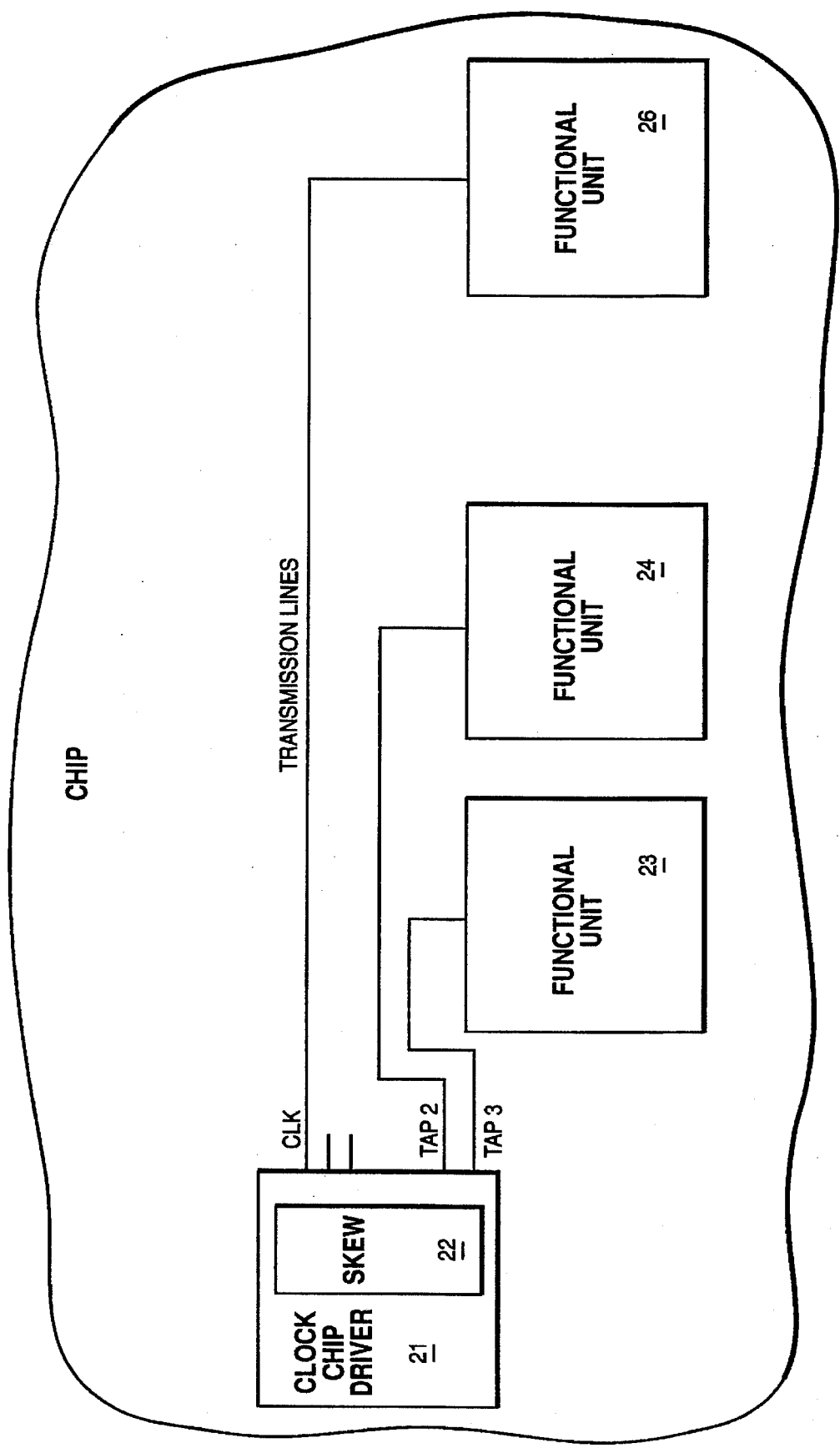
FIG. 6 is a schematic depicting functional units distributed over an integrated circuit chip.

FIG. 6 illustrates an on-chip embodiment of the invention. In this case on-chip timing, simultaneous switching, logic race conditions, and the similar problems are controlled within and between functional units 23, 24 and 26 by providing precisely skewed variations of the clock signal. In this embodiment the on-chip clock signal originates in chip clock driver 21 and is selectably skewed by skew block 22.

Though the invention has been described and illustrated by way of a specific embodiment, the systems and methods encompassed by the invention should be interpreted to be in keeping with the breadth of the claims set forth hereinafter.

I claim:

1. A system for generating a skewed clock signal, comprising:

means for creating a feedback oscillation signal using a first controllable delay line;

a second controllable delay line, fabricated to have substantially identical functional characteristics to the first controllable delay line, connected to receive a base clock signal;

frequency comparator means for concurrently controlling delay in the first and second controllable delay lines in proportion to the difference between the frequency of the feedback oscillation signal and a subharmonic of the base clock signal; and means for tapping the base clock signal as skewed at an incremental position along the second controllable delay line.

2. The system recited in claim 1, wherein the frequency of the feedback oscillation signal is half the frequency of the base clock signal.

3. The system recited in claim 2, wherein the frequency comparator compares the feedback oscillation signal with the output of a frequency divider directly driven by the base clock signal.

4. The system recited in claim 2, wherein the means for tapping the base clock signal comprises at least one physical connection to a node between stages of multiple transistorized delay elements in the second delay line.

5. A method for generating a skewed clock signal, comprising the steps of:

creating a feedback oscillation signal using a first controllable delay line;

providing a base clock signal to a second controllable delay line, the second controllable delay line being fabricated to have substantially identical functional characteristics to the first controllable delay line;

concurrently controlling delay in the first and second controllable delay lines in proportion to the difference between the frequency of the feedback oscillation signal and a subharmonic of the base clock signal; and tapping the base clock signal as skewed at an incremental position along the second controllable delay line.

6. The method recited in claim 5, wherein the frequency of the feedback oscillation signal is half the frequency of the base clock signal.

7. The method recited in claim 6, wherein the concurrent control step is accomplished by comparing the feedback oscillation signal with the output of a frequency divider directly driven by the base clock signal.

8. The method recited in claim 6, wherein the tapping step is accomplished by connecting to a node between stages of multiple transistorized delay elements in the second delay line.

* * * * *